(12) United States Patent
Pullen et al.

(10) Patent No.: US 11,557,964 B2
(45) Date of Patent: Jan. 17, 2023

(54) HIGH-EFFICIENCY LOW-RIPPLE BURST MODE FOR A CHARGE PUMP

(71) Applicant: Qualcomm Incorporated, San Diego, CA (US)

(72) Inventors: Stuart Pullen, Carolina Beach, NC (US); Jialei Xu, Santa Clara, CA (US); Chunping Song, Palo Alto, CA (US); Ta-Tung Yen, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/334,642

(22) Filed: May 28, 2021

(65) Prior Publication Data

US 2021/0376719 A1   Dec. 2, 2021

Related U.S. Application Data

(60) Provisional application No. 63/033,114, filed on Jun. 1, 2020.

(51) Int. Cl.
| | |
|---|---|
| *G05F 1/10* | (2006.01) |
| *G05F 3/02* | (2006.01) |
| *H02M 3/07* | (2006.01) |
| *H03K 3/037* | (2006.01) |
| *G06F 1/12* | (2006.01) |
| *H03K 5/24* | (2006.01) |
| *H02M 1/14* | (2006.01) |

(52) U.S. Cl.
CPC ............... *H02M 3/07* (2013.01); *G06F 1/12* (2013.01); *H02M 1/14* (2013.01); *H03K 3/037* (2013.01); *H03K 5/24* (2013.01)

(58) Field of Classification Search
CPC .. H02M 3/073; H02M 3/07; H02M 2003/077; G11C 5/145; G05F 3/205
USPC ........................................ 327/536; 363/59–60
See application file for complete search history.

(56) References Cited

U.S. PATENT DOCUMENTS

| | | | |
|---|---|---|---|
| 2001/0017566 A1* | 8/2001 | Nakahara ................ | H02M 3/07 327/536 |
| 2012/0274394 A1* | 11/2012 | Chan ........................ | H02M 1/14 327/536 |

* cited by examiner

*Primary Examiner* — Quan Tra
(74) *Attorney, Agent, or Firm* — Colby Nipper

(57) ABSTRACT

An apparatus is disclosed for operating a charge pump in a high-efficiency low-ripple burst mode. In an example aspect, the apparatus includes a charge pump with a flying capacitor, a switching circuit, and a burst-mode controller. The switching circuit is coupled to the flying capacitor and configured to selectively: be in a burst configuration to charge and discharge the flying capacitor based on a clock signal; or be in a pulse-skipping configuration. The burst-mode controller is coupled to the switching circuit and configured to trigger the switching circuit to transition from the pulse-skipping configuration to the burst configuration at a time that occurs between rising edges of the clock signal. The burst-mode controller is also configured to cause charging of the flying capacitor to occur for approximately half a period of the clock signal responsive to triggering the switching circuit to transition from the pulse-skipping configuration to the burst configuration.

30 Claims, 8 Drawing Sheets

500

```
┌─────────────────────────────────────────┐
│  Cause a switching circuit of a charge pump  │
│      to be in a pulse-skipping configuration │
│                   502                    │
└─────────────────────────────────────────┘
                    │
                    ▼
┌─────────────────────────────────────────┐
│  Trigger the switching circuit to transition from │
│   the pulse-skipping configuration to a burst │
│     configuration on at a time that occurs │
│       between rising edges of a clock signal │
│                   504                    │
└─────────────────────────────────────────┘
                    │
                    ▼
┌─────────────────────────────────────────┐
│    Cause a flying capacitor of the charge pump │
│    to be charged for approximately half a period │
│   of the clock signal responsive to the triggering │
│                   506                    │
└─────────────────────────────────────────┘
```

FIG. 5

HIGH-EFFICIENCY LOW-RIPPLE BURST MODE FOR A CHARGE PUMP

CROSS-REFERENCE TO RELATED APPLICATION(S)

This application claims the benefit of U.S. Provisional Application No. 63/033,114, filed 1 Jun. 2020, the disclosure of which is hereby incorporated by reference in its entirety herein.

TECHNICAL FIELD

This disclosure relates generally to power systems and, more specifically, to a charge pump that can realize low output voltage ripple during a burst mode.

BACKGROUND

A charge pump is a type of switched-capacitor voltage converter, which can be used to transfer power from a power source to a load. The charge pump can provide an output voltage that is greater than or less than an input voltage. To provide this output voltage, the charge pump uses switches to selectively charge or discharge a flying capacitor. Controlling these switches during light loading conditions while maintaining a given efficiency level (e.g., greater than 90%), however, can be problematic.

SUMMARY

Techniques and apparatuses are disclosed that operate a charge pump according to a high-efficiency low-ripple burst mode. In particular, the charge pump includes a burst-mode controller that configures the charge pump for bursting or pulse skipping. The burst-mode controller includes a clock-reset circuit and a synchronization circuit. The clock-reset circuit triggers a rising edge of a clock signal once the burst-mode controller determines to transition from pulse skipping to bursting. This transition and clock reset can reduce a delay or prevent a significant delay from occurring, which may otherwise increase voltage ripple at an output node. This clock reset also ensures that the charge pump charges the flying capacitor before discharging it. The synchronization circuit can prevent runt pulses from occurring, which protects switches within the charge pump. By reducing the amount of voltage ripple, the charge pump can operate at a higher efficiency as compared to other low-power modes that have larger amounts of ripple.

In an example aspect, an apparatus is disclosed. The apparatus includes a charge pump with a flying capacitor, a switching circuit, and a burst-mode controller. The switching circuit is coupled to the flying capacitor and configured to selectively: be in a burst configuration to charge and discharge the flying capacitor based on a clock signal; or be in a pulse-skipping configuration. The burst-mode controller is coupled to the switching circuit and configured to trigger the switching circuit to transition from the pulse-skipping configuration to the burst configuration at a time that occurs between rising edges of the clock signal. The burst-mode controller is also configured to cause the charging of the flying capacitor to occur for approximately half a period of the clock signal responsive to triggering the switching circuit to transition from the pulse-skipping configuration to the burst configuration.

In an example aspect, an apparatus is disclosed. The apparatus includes a charge pump with capacitive means for storing energy. The charge pump also includes switching means for selectively connecting the capacitive means according to a burst configuration or a pulse-skipping configuration. The charge pump also includes control means for triggering the switching means to transition from the pulse-skipping configuration to the burst configuration at a time that occurs between rising edges of a clock signal and causing the capacitive means to be charged for approximately half a period of the clock signal responsive to the triggering of the switching means to transition from the pulse-skipping configuration to the burst configuration.

In an example aspect, a method for operating a burst-mode controller is disclosed. The method includes causing a switching circuit of a charge pump to be in a pulse-skipping configuration. The method also includes triggering the switching circuit to transition from the pulse-skipping configuration to a burst configuration at a time that occurs between rising edges of a clock signal. The method additionally includes causing a flying capacitor of the charge pump to be charged for approximately half a period of the clock signal responsive to the triggering.

In an example aspect, an apparatus is disclosed. The apparatus includes a charge pump with a flying capacitor, a switching circuit, and a burst-mode controller. The switching circuit is coupled to the flying capacitor. The burst-mode controller is coupled to the switching circuit and includes a clock circuit, a clock-reset circuit, and a synchronization circuit. The clock-reset circuit is coupled to an input of the clock circuit. The synchronization circuit is coupled to an input of the clock-reset circuit and an output of the clock circuit.

BRIEF DESCRIPTION OF DRAWINGS

FIG. 2-1 illustrates an example charge pump, which can operate according to a high-efficiency low-ripple burst mode.

FIG. 2-2 illustrates an example burst configuration of a charge pump.

FIG. 2-3 illustrates an example pulse-skipping configuration of a charge pump.

FIG. 3 illustrates an example burst-mode controller for operating a charge pump according to a high-efficiency low-ripple burst mode.

FIG. 4-1 illustrates an example signal diagram for operating a charge pump according to a high-efficiency low-ripple burst mode.

FIG. 4-2 illustrates an example signal diagram for resetting a rising edge of a clock signal according to a high-efficiency low-ripple burst mode.

FIG. 5 is a flow diagram illustrating an example process for operating a charge pump according to a high-efficiency low-ripple burst mode.

DETAILED DESCRIPTION

Figure 1:
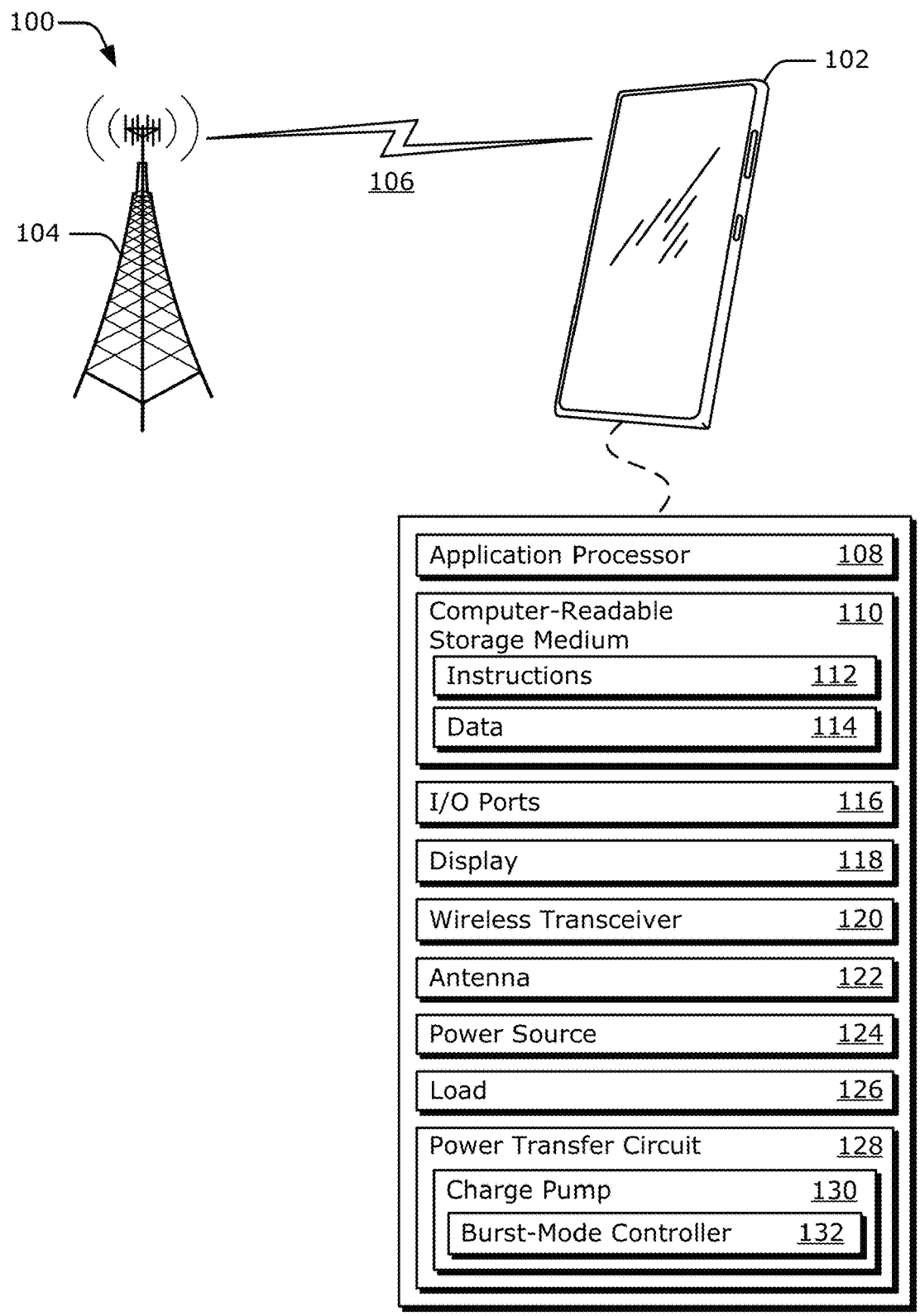
FIG. 1 illustrates an example environment for operating a charge pump according to a high-efficiency low-ripple burst mode.

A charge pump is a type of switched-capacitor voltage converter, which can be used to transfer power from a power source to a load. The charge pump can provide an output voltage that is greater than or less than an input voltage. To provide this output voltage, the charge pump uses switches to selectively charge or discharge a flying capacitor. The charge pump typically operates at 50% duty cycle, which means that the flying capacitor charges for half of a period and discharges for the remaining half of the period.

A load current drawn by the load can cause the output voltage provided by the charge pump to drop (e.g., decrease), creating a voltage regulation error. The amount by which the output voltage drops is proportional to the load current and the output impedance of the charge pump.

Some techniques operate a charge pump according to a burst mode (e.g., low current mode (LCM)) during light loading conditions. The burst mode enables the charge pump to alternate between periods of switching (e.g., bursting) and periods of pulse skipping to regulate the output voltage. During bursting, the charge pump switches between charging and discharging the flying capacitor. During pulse skipping, the charge pump is in a stand-by state and does not perform any switching operations. The burst mode enables the charge pump to perform pulse skipping for at least a portion of time, which improves the efficiency of the charge pump during light loading conditions.

Some charge-pump controllers implement a synchronous burst mode, which synchronizes the bursting and skipping operations to a clock signal. This synchronizing, however, can introduce a variable delay in transitioning between bursting and pulse skipping. Consider, for example, that the charge-pump controller determines to transition from pulse skipping to bursting at a time that occurs between rising edges of the clock. In this case, the charge pump has to wait for an edge of the clock before the transition can occur. The waiting period increases a delay associated with the charge pump transitioning from pulse skipping to bursting. This reduces efficiency of the charge pump. This variable delay also increases an amount of ripple present at the output voltage. During the delay, the output voltage continues to decrease, which increases the overall voltage ripple.

Sometimes the time interval for pulse skipping during light loading conditions can cause the charge pump to switch at an audible frequency, which may cause an output capacitor to emit an audible noise. Reducing the output ripple can reduce or eliminate the audible noise, even when the charge pump bursting periods are in the audio range (e.g., approximately 20 hertz (Hz) to 20 kilohertz (kHz)).

Other charge-pump controllers implement an asynchronous burst mode. Although this lack of synchronicity can enable the charge pump to avoid introducing a delay based on the clock signal, this asynchronous logic can introduce runt pulses. Runt pulses are clipped (e.g., shortened) periods of the charging or discharging cycle, which can decrease efficiency of the charge pump. This cycle shortening prevents the flying capacitor from being completely charged during the intended charging cycle or from being completely discharged during the intended discharging cycle. The runt pulses can also degrade the reliability of switches within the charge pump by forcing the switches to turn on and off at high currents, which can exceed safe operating conditions. In some cases, the asynchronous burst mode can cause the discharging cycle to activate before the charging cycle. This can further decrease the output voltage, which increases the overall voltage ripple. It is therefore desirable to operate the charge pump at high efficiency without causing large voltage ripples or runt pulses.

To address these issues, techniques for operating a charge pump according to a high-efficiency low-ripple burst mode are described herein. In example implementations, charge pump includes a burst-mode controller that configures the charge pump for bursting or pulse skipping. The burst-mode controller includes a clock-reset circuit and a synchronization circuit. The clock-reset circuit can trigger a rising edge of a clock signal once the burst-mode controller determines to transition from pulse skipping to bursting. This advancement of a next clock edge can prevent a significant delay from being incurred.

Significant delay could increase voltage ripple at an output node. This clock-reset also ensures that the charge pump charges the flying capacitor before discharging it. The synchronization circuit can prevent runt pulses from occurring, which protects switches within the charge pump. By reducing the amount of ripple, the charge pump can operate at higher efficiency compared to other low-power burst modes that have larger amounts of ripple. In some implementations, the voltage ripple can be reduced by 60% or more by the high-efficiency low-ripple burst mode that is described herein as compared to other modes. As an example, the voltage ripple can be approximately 60 millivolts.

FIG. 1 illustrates an example environment 100 for operating a charge pump according to a high-efficiency low-ripple burst mode. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi™); IEEE 802.15 (e.g., Bluetooth™); IEEE 802.16 (e.g., WiMAX™); and so forth. In some implementations, the wireless link 106 may wirelessly provide power and the base station 104 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

The computing device 102 also includes at least one power source 124, at least one load 126, and at least one power transfer circuit 128. The power source 124 can represent a variety of different types of power sources, including a wired power source, a solar charger, a portable charging station, a wireless charger, a battery, a capacitor, and so forth. Depending on the type of computing device 102, the battery may comprise a lithium-ion battery, a lithium polymer battery, a nickel-metal hydride battery, a nickel-cadmium battery, a lead acid battery, and so forth. In some cases, the battery can include multiple batteries, such as a main battery and a supplemental battery, and/or multiple battery cell combinations.

The power transfer circuit 128 transfers power from the power source 124 to one or more loads 126 of the computing device 102. Generally, the power level provided via the power transfer circuit 128 and the power source 124 is at a level sufficient to power the one or more loads 126. For example, the power level may be on the order of milliwatts (mW) for powering loads associated with a smartphone, or on the order of watts to kilowatts (kW) for powering loads associated with an electric vehicle. Example types of loads include a variable load, a load associated with a component of the computing device 102 (e.g., the application processor 108, an amplifier within the wireless transceiver 120, the display 118, a battery, or a power converter), a load that is external to the computing device 102 (e.g., another battery), and so forth. The power transfer circuit 128 can be a stand-alone component or integrated within another component, such as a power management integrated circuit (PMIC) (not shown).

The power transfer circuit 128 includes at least one charge pump 130 (e.g., a switched-capacitor voltage converter), which can be implemented as a voltage divider-type charge pump or a voltage multiplier-type charge pump. For example, the charge pump 130 can implement a divide-by-two charge pump that provides a 2:1 conversion ratio, a multiply-by-two charge pump that provides a 1:2 conversion ratio, and so forth. Generally, the charge pump 130 can implement a divide-by-N charge pump or a multiply-by-N charge pump, where N represents a positive integer (e.g., 1, 2, 3, or 4).

The charge pump 130 includes a burst-mode controller 132, which controls an operation of the charge pump 130 during light loading conditions. As an example, the light loading condition can occur if the load current drawn by the load 126 is less than an ampere (A), such as less than approximately 300 mA, for hand-held or portable electronic devices. Although not shown, the charge pump 130 can include other types of controllers that control the operation of the charge pump 130 during other loading conditions, such as during a heavy loading condition. Some of these controllers can cause the switching within the charge pump 130 to operate at a relatively high frequency compared to the frequency controlled by the burst-mode controller 132. For example, the burst-mode controller 132 can cause the charge pump 130 to switch according to a hundred kilohertz (kHz) frequency when bursting but with a burst interval frequency that can be less than or equal to 50 Hz (e.g., 45 Hz, 20 Hz, or 1 Hz). In contrast, another controller can cause the charge pump 130 to switch according to a 400 kHz frequency. The burst-mode controller 132, at least partially, enables the charge pump 130 to operate according to a high-efficiency low-ripple burst mode, as further described with respect to FIGS. 2-1 to 4-2.

Figures 1, 2:
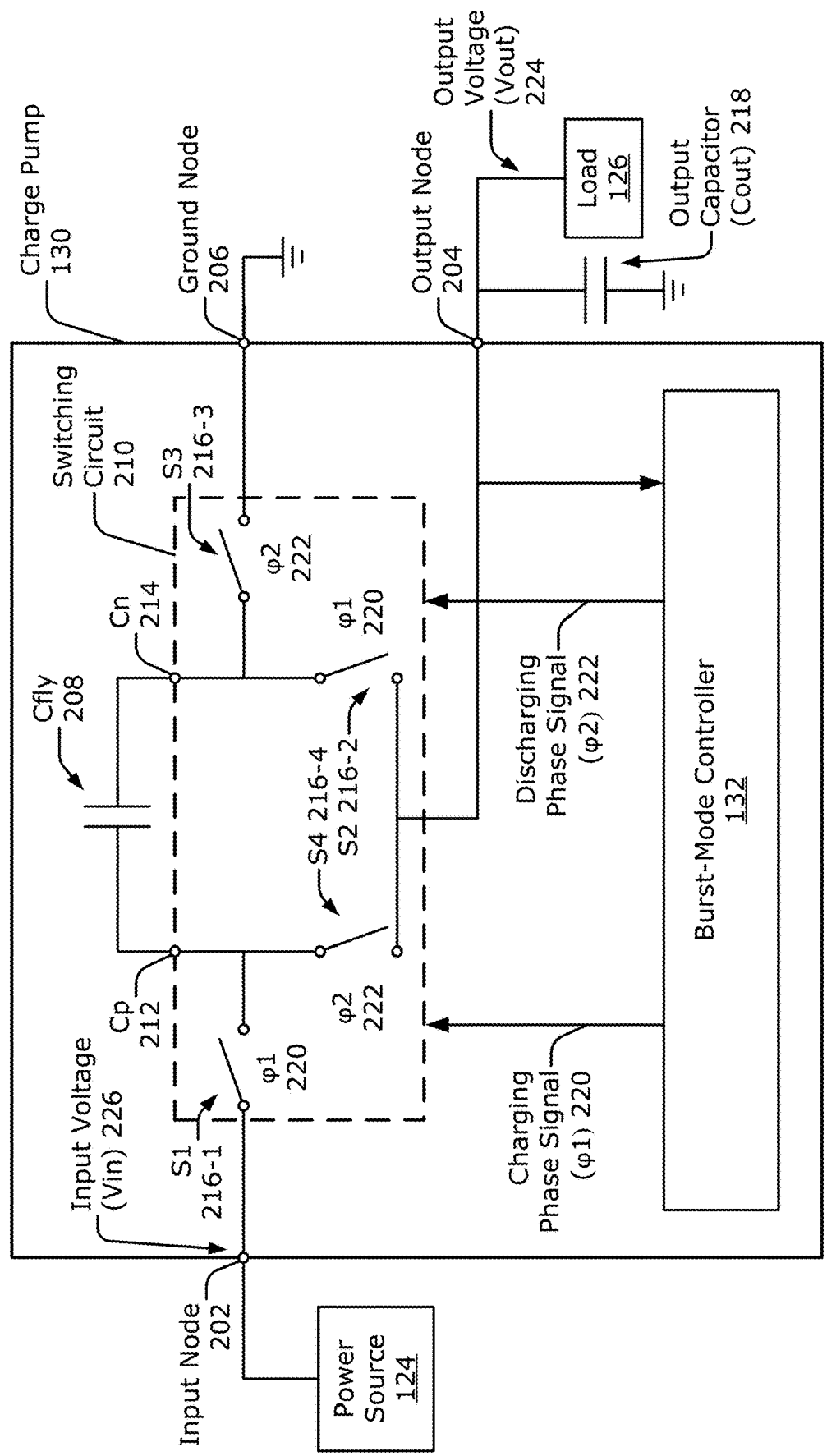
Figure 2:
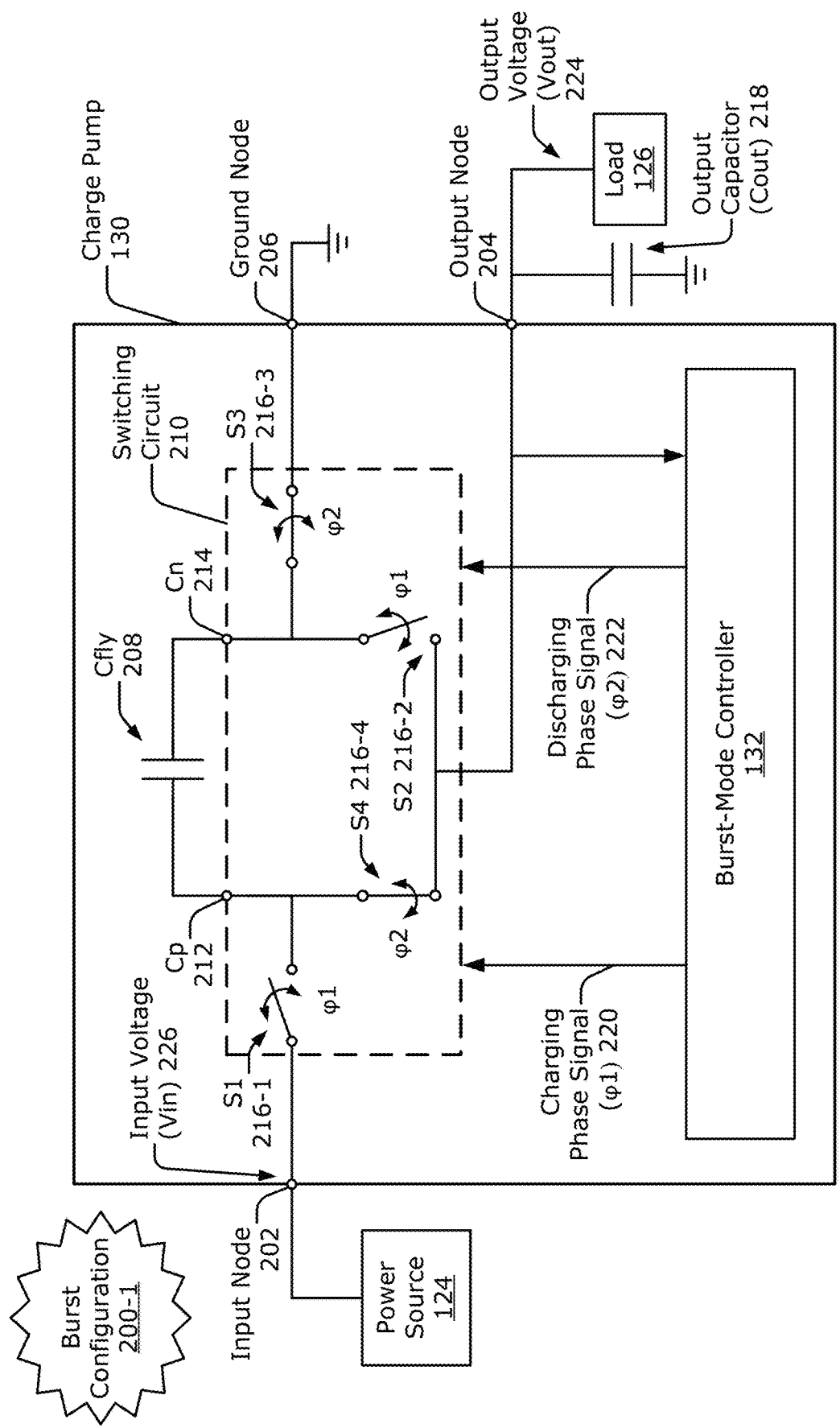

FIG. 2-1 illustrates an example charge pump 130, which can operate according to a high-efficiency low-ripple burst mode. In the depicted configuration, the charge pump 130 implements a divide-by-two charge pump; however, the described principles are applicable to divide-by-N and multiply-by-N charge pumps. The charge pump 130 includes an input node 202, an output node 204, and a ground node 206. The input node 202 is coupled to the power source 124. The output node 204 is coupled to the load 126. The ground node 206 is coupled to a ground. The term "node" represents at least a point of electrical connection between two or more components (e.g., circuit elements). Although visually depicted as a single point, the node represents a connected portion of a network that has approximately a same voltage potential between two or more components. In other words, a node can represent at least one of multiple points along a conducting medium (e.g., a wire or trace) that exists between electrically connected components.

The charge pump 130 also includes at least one flying capacitor 208 ($C_{Fly}$ 208) and at least one switching circuit 210. The flying capacitor 208 is coupled to a positive node 212 ($C_P$ 212) and a negative node 214 ($C_N$ 214). The switching circuit 210 can be implemented within an integrated circuit and includes at least four switches 216-1 to 216-4. The switches 216-1 to 216-4 can be implemented using transistors, such as metal-oxide-semiconductor field-effect transistors (MOSFETs), junction field-effect transistors (JFETs), bipolar junction transistors (BJTs), insulated gate bipolar transistors (IGBTs), diodes, and so forth. The switches 216-1 to 216-4 can selectively be in a closed state or an open state.

The first switch 216-1 (S1) is coupled between the input node 202 and the positive node 212. The second switch 216-2 (S2) is coupled between the negative node 214 and the output node 204. The first switch 216-1 and the second switch 216-2 can operate together to form a charging circuit, which charges the flying capacitor 208.

The third switch 216-3 (S3) is coupled between the negative node 214 and the ground node 206. The fourth switch 216-4 (S4) is coupled between the positive node 212 and the output node 204. The third switch 216-3 and the fourth switch 216-4 can operate together to form a discharging circuit, which discharges the flying capacitor 208 by transferring energy from the flying capacitor 208 to an output capacitor 218 (Cout 218).

The burst-mode controller 132 is coupled to the switching circuit 210 and the output node 204. The burst-mode controller 132 controls the states of the switches 216-1 to 216-4. In particular, the burst-mode controller 132 generates a charging phase signal (φ1) 220 and a discharging phase signal (φ2) 222. The charging phase signal 220 controls states of the switches 216-1 and 216-2. The discharging phase signal 222 controls states of the switches 216-3 and 216-4. In general, the discharging phase signal 222 is an inverse of the charging phase signal 220.

During burst-mode operation, the charge pump 130 generates an output voltage 224 at the output node 204 that is approximately half an input voltage 226 at the input node 202. To achieve the target 2:1 conversion ratio, the burst-mode controller 132 causes the charge pump 130 to alternate between periods of switching (e.g., bursting) and periods of pulse skipping in which the charge pump 130 is in a stand-by state (e.g., the switching circuit 210 is not switching). In other words, the burst-mode causes the charge pump 130 to alternate between a burst configuration and a pulse-skipping configuration, which are further described with respect to FIGS. 2-2 and 2-3, respectively.

FIG. 2-2 illustrates an example burst configuration 200-1 of the charge pump 130. The charge pump 130 is configured according to the burst configuration 200-1 during the periods of bursting. In particular, the switching circuit 210 alternates between a charging configuration, which enables the flying capacitor 208 to be charged, and a discharging configuration, which enables the flying capacitor 208 to be discharged. In the charging configuration, the charging phase signal 220 causes the switches 216-1 and 216-2 to be in the closed state, and the discharging phase signal 222 causes the switches 216-3 and 216-4 to be in the open state. This results in the flying capacitor 208 being connected between the input node 202 and the output node 204. In the discharging configuration, the charging phase signal 220 causes the switches 216-1 and 216-2 to be in the open state, and the discharging phase signal 222 causes the switches 216-3 and 216-4 to be in the closed state. This results in the flying capacitor 208 being connected between the ground node 206 and the output node 204.

Figures 2, 3:
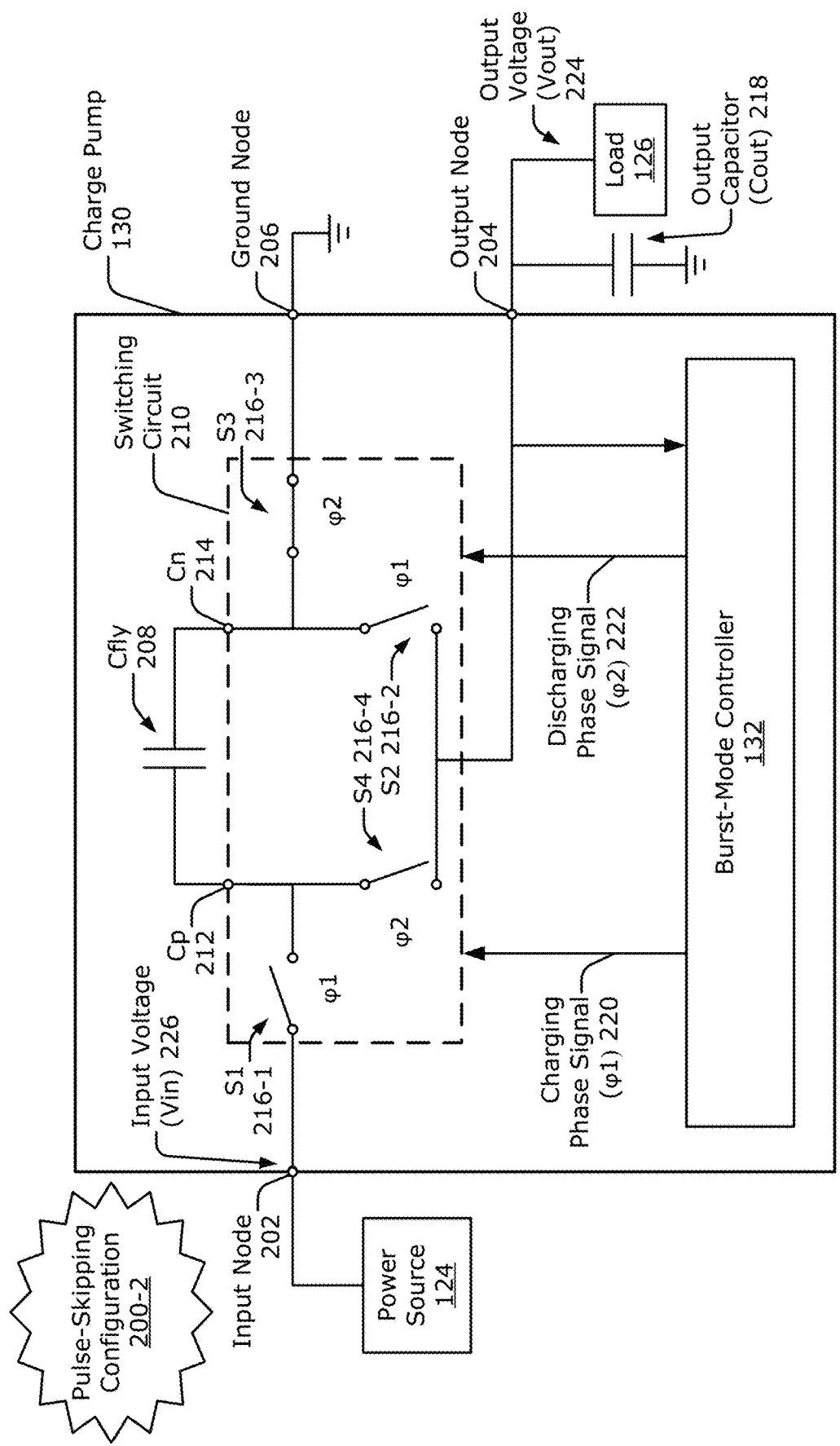
Figure 3:
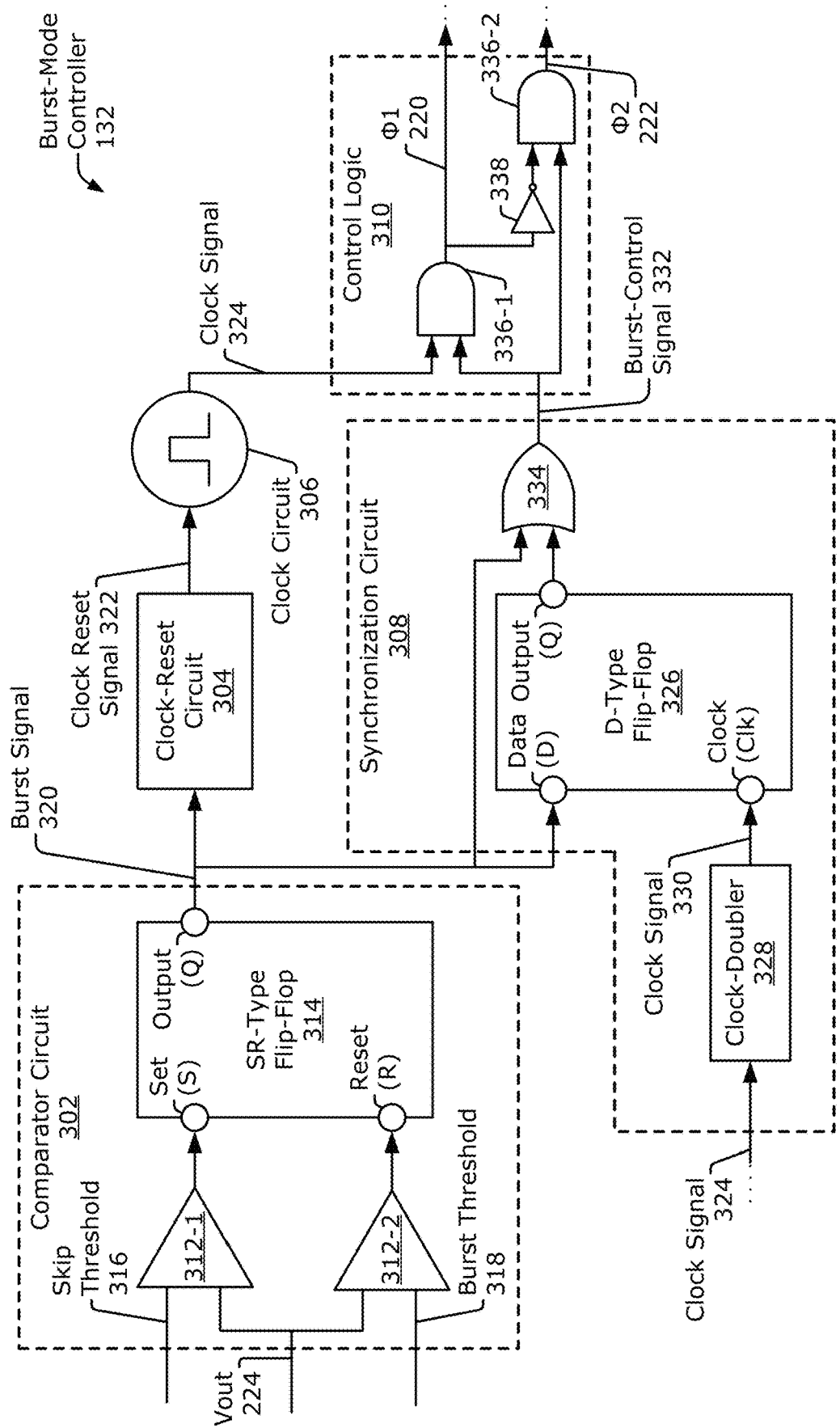

FIG. 2-3 illustrates an example pulse-skipping configuration 200-2 of the charge pump 130. The charge pump 130 is configured according to the pulse-skipping configuration 200-2 during the periods of pulse skipping (e.g., skip intervals or time between bursting events). The pulse-skipping configuration 200-2 can also be referred to as a stand-by configuration. In the pulse-skipping configuration 200-2, the charging phase signal 220 causes the switches 216-1 and 216-2 to be in the open state. The discharging phase signal 222 causes the switches 216-3 and 216-4 to be in the closed state or the open state. For example, the third switch 216-3 can be in the closed state to connect the flying capacitor 208 to the ground node 206, and the fourth switch 216-4 can be in the open state to disconnect the flying capacitor 208 from the output node 204 (e.g., cause the flying capacitor 208 to float). In another example, both of the switches 216-3 and 216-4 can be in the closed state to connect the flying capacitor 208 between the ground node 206 and the output node 204.

In general, the time between bursting events increases as the load current increases. A bursting event includes one or more bursting cycles (e.g., one thousand bursting cycles) during which the charge pump 130 operates at 50% duty cycle and the charging phase signal 220 and the discharging phase signal 222 have a fixed frequency (e.g., a frequency of approximately 100 kHz). The skip interval associated with each instance of pulse skipping can vary over time. As an example, a skip interval can be on the order of microseconds (e.g., 500 μs), on the order of milliseconds (ms) (e.g., 10 ms), or on the order of seconds (e.g., 1 second). The burst-mode controller 132 controls whether the charge pump 130 is in the burst configuration 200-1 or pulse-skipping configuration 200-2 during the burst mode based on the output voltage, as is further described with respect to FIG. 3.

FIG. 3 illustrates an example burst-mode controller 132 for operating the charge pump 130 according to a high-efficiency low-ripple burst mode. In the depicted configuration, the burst-mode controller 132 includes a comparator circuit 302, a clock-reset circuit 304, a clock circuit 306, a synchronization circuit 308, and control logic 310. The clock circuit 306 can be realized with any type of oscillator, such as a saw-tooth or triangle wave oscillator or a ring oscillator. As an example, the clock circuit 306 can operate at a frequency of approximately one hundred kHz.

The comparator circuit 302 is coupled to the output node 204 (of FIG. 2-1) and monitors the output voltage 224 to determine whether or not to perform bursting or pulse skipping. The comparator circuit 302 includes two comparators 312-1 and 312-2 and a set-reset (SR)-type flip-flop 314. The first comparator 312-1 is coupled to a set input (S) of the SR-type flip-flop 314 and compares the output voltage 224 to a skip threshold 316. The second comparator 312-2 is coupled to a reset input (R) of the SR-type flip-flop 314 and compares the output voltage 224 to a burst threshold 318. In general, the burst threshold 318 is less than the skip threshold 316. As an example, the skip threshold 316 can be approximately equal to half the input voltage 226 minus 30 millivolts (mV), and the burst threshold 318 can be approximately equal to half the input voltage 226 minus 100 mV.

At an output (Q) of the SR-type flip-flop 314, the comparator circuit 302 generates a burst signal 320 based on at least one comparison of the output voltage 224 to the skip threshold 316 and the burst threshold 318. If the output voltage 224 is less than or equal to the burst threshold 318, the comparator circuit 302 causes the burst signal 320 to have a high voltage, which triggers bursting to increase the output voltage 224. If the output voltage 224 becomes greater than or equal to the skip threshold 316, the comparator circuit 302 causes the burst signal 320 to have a low voltage, which triggers pulse skipping to conserve power and increase efficiency of the charge pump 130.

The clock-reset circuit 304 is coupled between the output (Q) of the SR-type flip-flop 314 and an input of the clock circuit 306. Responsive to the burst signal 320 being high, the clock-reset circuit 304 generates a clock reset signal 322 that resets the clock circuit 306. As an example, the clock reset signal 322 can be a short pulse, such as a ten nanosecond (ns) pulse. By resetting the clock circuit 306, the clock-reset circuit 304 triggers a rising edge of a clock signal 324. This can prevent a significant delay from occurring between an instance that the burst signal 320 transitions from low to high and an instance a rising edge of the clock signal 324 appears. In other words, the clock-reset circuit 304 synchronizes the clock circuit 306 to the burst signal 320. This enables bursting to start at non-integer multiples of the clock signal 324's period. In this manner, the burst-mode controller 132 can quickly direct the charge pump 130 to start bursting, which prevents the output voltage 224 from significantly decreasing below the burst threshold 318. This reduces the amount of voltage ripple at the output node 204 and improves efficiency.

This clock reset also ensures that the switching circuit 210 operates in the charging configuration first to charge the flying capacitor 208. As such, the clock-reset circuit 304 can prevent the charge pump 130 from discharging the flying capacitor 208 first and causing the output voltage 224 to decrease appreciably, which would increase the voltage ripple.

The synchronization circuit 308 is coupled to the output node (Q) of the SR-type flip-flop 314 and an output of the clock circuit 306. The synchronization circuit 308 includes a D-type flip-flop 326, a clock-doubler 328, and an OR gate 334. The clock-doubler 328 is coupled to the output of the clock circuit 306 to receive the clock signal 324. The clock-doubler 328 is coupled to a clock input (Clk) of the D-type flip-flop 326 and generates a clock signal 330 based on the clock signal 324. Here, the clock signal 330 has a frequency that is twice as high as a frequency of the clock signal 324. The clock-doubler 328 is synchronized with the clock circuit 306.

In an alternative implementation, the clock-doubler 328 can be implemented using the clock circuit 306 and a divide-by-2 flip-flop. In this case, the clock circuit 306 can operate at twice the target switching frequency to generate the clock signal 330, and the divide-by-2 flip-flop generates the clock signal 324 based on the clock signal 330 and provides the clock signal 324 to the control logic 310.

The synchronization circuit 308, using the OR gate 334, generates a burst-control signal 332 based on the burst signal 320 and the clock signal 330. The burst signal 320 is received at a data input (D) of the D-type flip-flop 326. The synchronization circuit 308, in conjunction with the control logic 310, uses the burst-control signal 332 to ensure that the charging phase signal 220 and the discharging phase signal 222 are on for a full half-period of the clock signal 324 (e.g., ensures that the charging phase signal 220 and the discharging phase signal 222 do not have any truncated (clipped) periods). In this manner, the synchronization circuit 308 prevents runt pulses from occurring within the charging phase signal 220 or the discharging phase signal 222 and therefore protects the switches 216-1 to 216-4 within the switching circuit 210. In general, the synchronization circuit 308 synchronizes the burst signal 320 to the clock signal 330, which is operating at twice a frequency of the clock signal 324.

The control logic 310 is coupled to the output of the clock circuit 306 and the output of the synchronization circuit 308. The control logic 310 generates the charging phase signal 220 and the discharging phase signal 222 based on the clock signal 324 and the burst-control signal 332. In the depicted configuration, the control logic 310 includes two AND gates 336-1 and 336-2 and an inverter 338. Although not shown, the control logic 310 can include other types of components, such as switch drivers and a circuit that controls dead time. Using the clock-reset circuit 304 and the synchronization circuit 308, the burst-mode controller 132 can enable the charge pump 130 to realize a low amount of voltage ripple and operate at high efficiency during a burst mode, as further described with respect to FIG. 4-1.

Figures 1, 4:
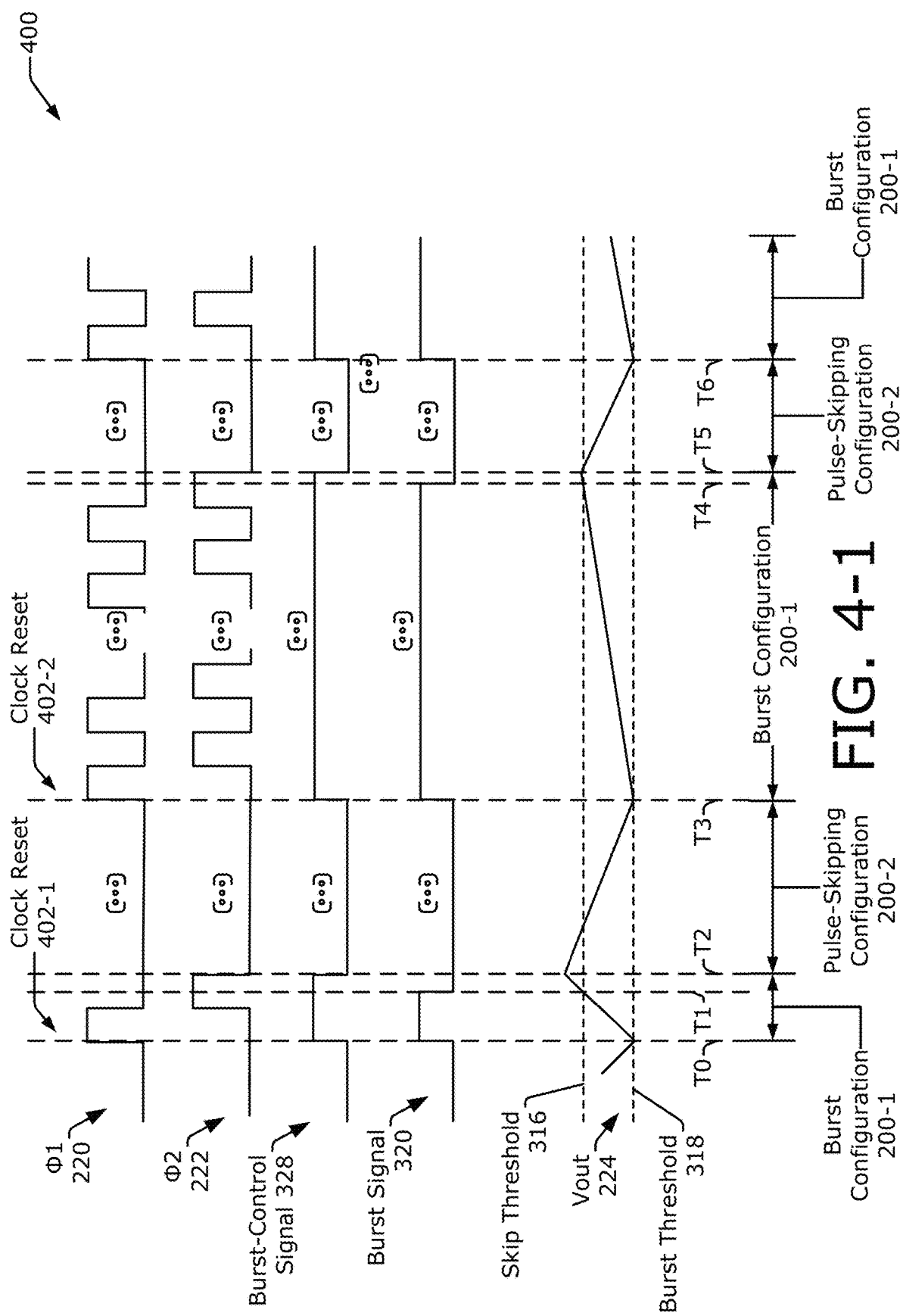
Figures 2, 4:
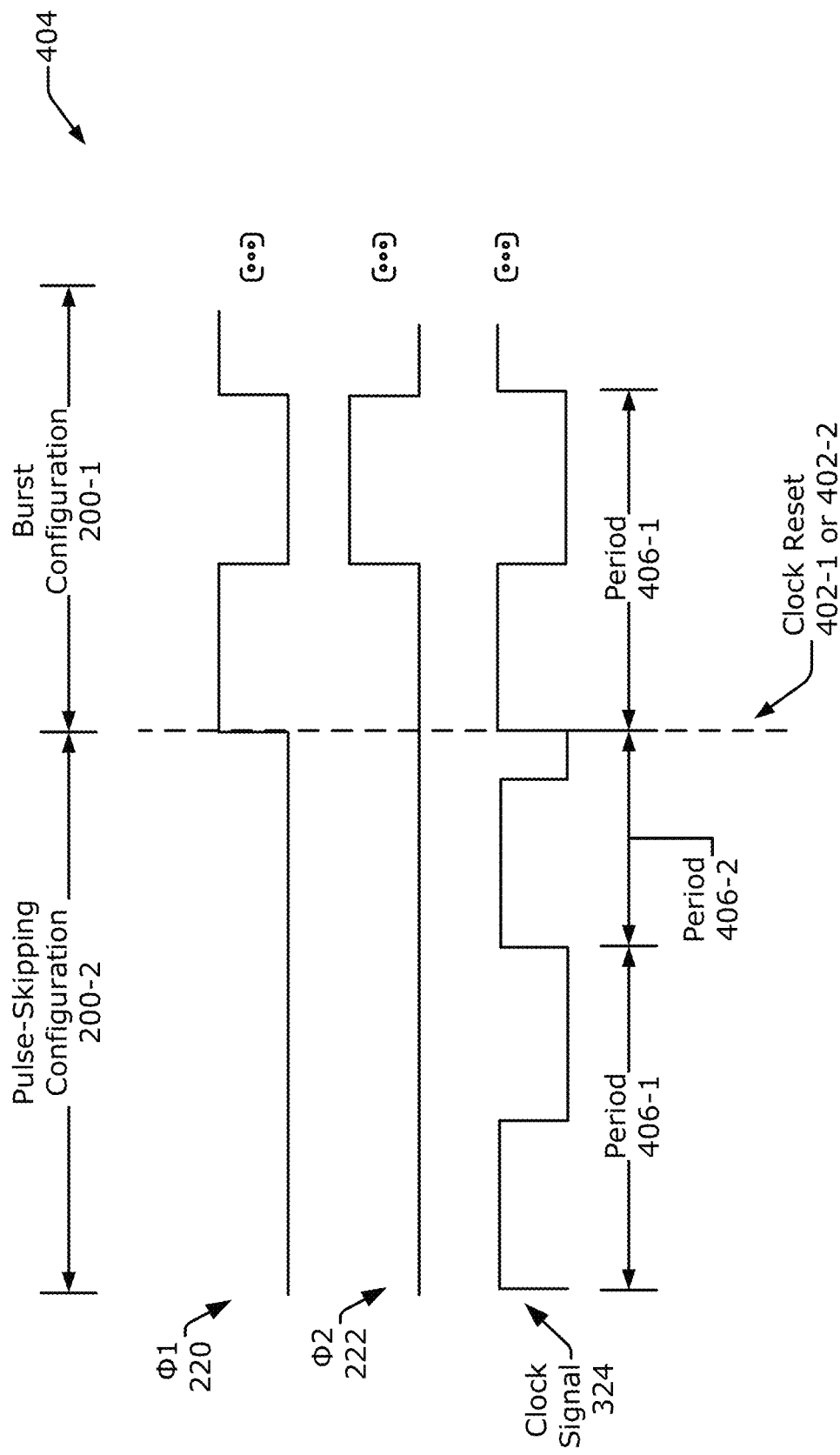

FIG. 4-1 illustrates an example signal diagram 400 for operating the charge pump 130 according to the high-efficiency low-ripple burst mode. The signal diagram 400 shows examples of the charging phase signal 220, the discharging phase signal 222, the burst-control signal 332, the burst signal 320, the skip threshold 316, the output voltage 224, and the burst threshold 318.

At time T0, the output voltage 224 is less than or equal to the burst threshold 318, which causes the burst signal 320 to transition from low to high. The burst signal 320 causes the clock-reset circuit 304 to perform a clock reset 402-1. This re-initializes the clock circuit 306 and causes the clock circuit 306 to generate a rising edge of the clock signal 324. The rising edge can be triggered independent of the current phase of the clock signal 324. In this way, the burst-mode controller 132 can reduce delays associated with synchronizing the burst-configuration 200-1 with the clock signal 324. As a result of the burst signal 320 and the clock signal 324 being high, the burst-control signal 332 and the charging phase signal 220 transition from low to high.

From time T0 to time T2, the charge pump 130 operates according to the burst configuration 200-1 and starts bursting. At time T1, the output voltage 224 exceeds the skip threshold 316, which causes the burst signal 320 to transition from high to low. However, due to the synchronization circuit 308, the burst-control signal 332 remains high in order to ensure the last phase during the burst cycle stays on for approximately a full half-period of the clock signal 324. In FIG. 4-1, the last phase is the discharging phase 222. This results in the burst-control signal 332 remaining high between time T1 and T2. At time T2, the burst-control signal 332 transitions from high to low, and the charge pump 130 operates according to the pulse-skipping configuration 200-2 and starts pulse skipping.

At time T3, the charge pump 130 stops pulse skipping and starts bursting due to the output voltage 224 becoming less than or equal to the burst threshold 318. Similar actions occur as described above with respect to time T0. In particular, the burst signal 320 transitions from low to high. The burst signal 320 causes the clock-reset circuit 304 to perform a clock reset 402-2. This re-initializes the clock circuit 306 and causes the clock circuit 306 to generate a rising edge of the clock signal 324. The rising edge can be triggered independent of a current phase of the clock signal 324. In this way, the burst-mode controller 132 can reduce delays associated with synchronizing the bursting with the clock signal 324. As a result of the burst signal 320 and the clock signal 324 being high, the burst-control signal 332 and the charging phase signal 220 transition from low to high.

From time T3 to time T5, the charge pump 130 operates according to the burst configuration 200-1. At time T4, the output voltage 224 exceeds the skip threshold 316, which causes the burst signal 320 to transition from high to low.

However, due to the synchronization circuit 308, the burst-control signal 332 remains high in order to ensure the discharging phase 222 is high for a full half-period of the clock signal 324. This results in the burst-control signal 332 remaining high between time T4 and T5. At time T5, the burst-control signal 332 transitions from high to low, and the charge pump 130 operates according to the pulse-skipping configuration 200-2 and starts pulse skipping. In this manner, the burst-mode controller 132 triggers the charge pump 130 to transition from the burst configuration 200-1 to the pulse-skipping configuration 200-2 on rising edges of the clock signal 324.

At time T6, the charge pump 130 stops pulse skipping and starts bursting due to the output voltage 224 becoming less than or equal to the burst threshold 318. Similar actions occur as described above with respect to times T0 and T3.

The periods of bursting and pulse skipping can vary over time based on the current drawn from the load 126. As an example, the current draw between time T0 and time T2 is smaller compared to the current draw between time T3 and T4. Consequently, the periods of pulse skipping can be longer in duration during the lighter loading conditions (e.g., between time T2 and time T3) and shorter in duration during heavier loading conditions (e.g., between time T5 and T6). In contrast, the periods of bursting can be shorter in duration during lighter loading conditions (e.g., between time T0 and time T2) and longer in duration during heavier loading conditions (e.g., between time T3 and time T4).

The signal diagram 400 shows that there is not an appreciable delay between the burst signal 320 transitioning from low to high and the charging phase 220 transitioning from low to high. As such, the output voltage 224 does not appreciably drop below the burst threshold 318. Consequently, the ripple in the output voltage 224 is reduced using this high-efficiency low-ripple burst mode compared to other types of modes that experience synchronization delays or runt pulses.

To exit the high-efficiency low-ripple burst mode, the charge pump 130 can include a circuit that monitors the bursting duration (e.g., counts the number of times the charging phase signal 220 transitions from high to low) and causes the charge pump 130 to transition to a different mode if the period (or count) exceeds a particular threshold. Additionally or alternatively, another circuit can monitor the output voltage 224 and direct the charge pump 130 to exit the high-efficiency low-ripple burst mode if the output voltage 224 falls below an out-of-bounds threshold, which is below the burst threshold 318. The clock resets 402-1 and 402-2 are further described with respect to FIG. 4-2.

FIG. 4-2 illustrates an example signal diagram 404 for resetting a rising edge of the clock signal 324 according to the high-efficiency low-ripple burst mode. Prior to the clock reset 402-1 or 402-2, the charge pump 130 operates according to the pulse-skipping configuration 200-2. During the pulse-skipping configuration 200-2, the clock signal 324 has a period 406-1, which represents a duration between rising edges of the clock signal 324. Sometimes the clock reset 402-1 or 402-2 occurs at a time between rising edges of the clock signal 324 (e.g., on a fraction of the period 406-1 of the clock signal 324 or away from rising edge of the clock signal 324). This causes the clock signal 324 to have a reset period 406-2, which is smaller than the switching period 406-1.

After the clock reset 402-1 or 402-2 occurs, the charge pump 130 operates according to the burst configuration 200-1, and the clock signal 324 has the period 406-1. As a result, the charge pump 130 charges the flying capacitor 208 for approximately half the period 406-1 of the clock signal 324. Also, the charge pump 130 discharges the flying capacitor 208 for approximately half the period 406-1 of the clock signal 324.

FIG. 5 is a flow diagram illustrating an example process 500 for operating a charge pump according to a high-efficiency low-ripple burst mode. The process 500 is described in the form of a set of blocks 502-506 that specify operations that can be performed. However, operations are not necessarily limited to the order shown in FIG. 5 or described herein, for the operations may be implemented in alternative orders or in fully or partially overlapping manners. Also, more, fewer, and/or different operations may be implemented to perform the process 500, or an alternative process. Operations represented by the illustrated blocks of the process 500 may be performed by a charge pump 130 (e.g., of FIG. 1 or 2-1). More specifically, the operations of the process 500 may be performed by a burst-mode controller 132, as shown in FIG. 2-1 or 3.

At block 502, a switching circuit of a charge pump is in a pulse-skipping configuration. For example, the burst-mode controller 132 causes the switching circuit 210 of the charge pump 130 to be in the pulse-skipping configuration 200-2, shown in FIG. 2-3. According to the pulse-skipping configuration 200-2, the switches 216-1 and 216-2 are in the open state and the switch 216-3 is in the closed state. The switch 216-4 can optionally be in the open state or the closed state. While the switching circuit 210 is in the pulse-skipping configuration 200-2, the flying capacitor 208 is not charged by the power source 124.

At block 504, the switching circuit is triggered to transition from the pulse-skipping configuration to a burst configuration at a time that occurs between rising edges of a clock signal. For example, the burst-mode controller 132 causes the switching circuit 210 to transition from the pulse-skipping configuration 200-2 to the burst configuration 200-1, shown in FIG. 2-2. The transition occurs on a at a time between rising edges of the clock signal 324, as shown in FIG. 4-2. For example, the transition can occur on a fraction of the period 406-1 (e.g., at a quarter, a half, or three-quarters of the period 406-1). In this situation, the transition does not occur on a rising edge of the clock signal 324. According to the burst configuration 200-1, the switches 216-1 and 216-2 together alternate between the open state and the closed state based on the charging phase signal 220. Also, the switches 216-3 and 216-4 together alternate between the closed state and the open state based on the discharging phase signal 222.

At block 506, a flying capacitor of the charge pump is charged for approximately half a period of the clock signal responsive to the triggering. For example, the burst-mode controller 132 causes the flying capacitor 208 to be charged for approximately half the period 406-1, as shown in FIG. 4-2. In this way, the flying capacitor 208 experiences a full charging cycle instead of a partial charging cycle. Furthermore, the burst-mode controller 132 ensures that the charging cycle occurs prior to a discharging cycle. With these techniques, the burst-mode controller 132 enables the charge pump 130 to operate according to a high-efficiency low-ripple burst mode, which reduces the amount of ripple within the output voltage 224 and improves an efficiency of the charge pump 130.

Some example aspects are described below.

Aspect 1: An apparatus comprising:
a charge pump comprising:
a flying capacitor;

a switching circuit coupled to the flying capacitor, the switching circuit configured to selectively:
be in a burst configuration to charge and discharge the flying capacitor based on a clock signal; or
be in a pulse-skipping configuration; and
a burst-mode controller coupled to the switching circuit, the burst-mode controller configured to:
trigger the switching circuit to transition from the pulse-skipping configuration to the burst configuration at a time that occurs between rising edges of the clock signal; and
cause charging of the flying capacitor to occur for approximately half a period of the clock signal responsive to triggering the switching circuit to transition from the pulse-skipping configuration to the burst configuration.

Aspect 2: The apparatus of aspect 1, wherein the burst-mode controller is configured to reset a rising edge of the clock signal to trigger the switching circuit to transition from the pulse-skipping configuration to the burst configuration and cause the charging of the flying capacitor to occur for approximately half the period of the clock signal.

Aspect 3: The apparatus of aspect 2, wherein:
the burst-mode controller is configured to generate a charging phase signal based on the clock signal;
the charging phase signal controls a set of switches of the switching circuit; and
the charging phase signal has pulses with durations that are approximately equal to half the period of the clock signal.

Aspect 4: The apparatus of aspect 3, wherein the burst-mode controller is configured to reset the rising edge of the clock signal to prevent the charging phase signal from having a pulse with a duration that is substantially less than half the period of the clock signal.

Aspect 5: The apparatus of any preceding aspect, wherein the burst-mode controller is configured to trigger the switching circuit to transition from the burst configuration to the pulse-skipping configuration on a rising edge of the clock signal.

Aspect 6: The apparatus of aspect 5, wherein the burst-mode controller is configured to cause the switching circuit to discharge the flying capacitor for approximately half the period of the clock signal prior to triggering the switching circuit to transition from the burst configuration to the pulse-skipping configuration.

Aspect 7: The apparatus of any preceding aspect, wherein the burst-mode controller comprises:
a clock circuit;
a clock-reset circuit coupled to an input of the clock circuit; and
a synchronization circuit coupled to an input of the clock-reset circuit and an output of the clock circuit.

Aspect 8: The apparatus of aspect 7, wherein:
the clock circuit is configured to generate the clock signal;
the clock-reset circuit is configured to reset a rising edge of the clock signal; and
the synchronization circuit is configured to generate a burst-control signal to synchronize the burst configuration to another clock signal having a frequency that is approximately two times greater than a frequency of the clock signal.

Aspect 9: The apparatus of aspect 7, wherein the burst-mode controller comprises:
a comparator circuit coupled to the input of the clock-reset circuit; and
control logic coupled to the output of the clock circuit, an output of the synchronization circuit, and the switching circuit.

Aspect 10: The apparatus of aspect 9, wherein:
the comparator circuit is configured to:
monitor an output voltage generated by the switching circuit and the flying capacitor;
compare the output voltage to a burst threshold; and
generate a burst signal having a first amplitude responsive to the output voltage being greater than the burst threshold and a second amplitude responsive to the output voltage being less than the burst threshold; and
the control logic is configured to generate signals that cause the switching circuit to transition to the burst configuration.

Aspect 11: The apparatus of aspect 10, wherein:
the clock-reset circuit is configured to reset a rising edge of the clock signal responsive to the burst signal having an amplitude that changes from the first amplitude to the second amplitude;
the synchronization circuit is configured to generate a burst-control signal to synchronize the burst signal to another clock signal having a frequency that is approximately two times greater than a frequency of the clock signal; and
the control logic is configured to generate a charging phase signal and a discharging phase signal based on the clock signal and the burst-control signal.

Aspect 12: The apparatus of any one of aspects 7-11, wherein the synchronization circuit comprises:
a D-type flip-flop having a data input coupled to the input of the clock-reset circuit;
a clock-doubler having an input coupled to the output of the clock circuit and an output coupled to a clock input of the D-type flip-flop; and
a logic gate having a first input coupled to the input of the clock-reset circuit and a second input coupled to an output of the D-type flip-flop.

Aspect 13: The apparatus of any preceding aspect, wherein the switching circuit comprises:
a first switch configured to selectively connect or disconnect a first terminal of the flying capacitor to a power source;
a second switch configured to selectively connect or disconnect a second terminal of the flying capacitor to a load;
a third switch configured to selectively connect or disconnect the second terminal of the flying capacitor to ground; and
a fourth switch configured to selectively connect or disconnect the first terminal of the flying capacitor to the load.

Aspect 14: The apparatus of aspect 13, wherein:
the first switch and the second switch are configured to be in an open state responsive to the switching circuit being in the pulse-skipping configuration;
the third switch is configured to be in a closed state responsive to the switching circuit being in the pulse-skipping configuration; and
the fourth switch is configured to be in the open state or the closed state responsive to the switching circuit being in the pulse-skipping configuration.

Aspect 15: An apparatus comprising:
a charge pump comprising:
capacitive means for storing energy;
switching means for selectively connecting the capacitive means according to a burst configuration or a pulse-skipping configuration; and
control means for:

triggering the switching means to transition from the pulse-skipping configuration to the burst configuration at a time that occurs between rising edges of a clock signal; and causing the capacitive means to be charged for approximately half a period of the clock signal responsive to the triggering of the switching means to transition from the pulse-skipping configuration to the burst configuration.

Aspect 16: The apparatus of aspect 15, wherein the control means comprises means for resetting a rising edge of the clock signal.

Aspect 17: The apparatus of aspect 15 or 16, wherein the control means comprises means for triggering the switching means to transition from the burst configuration to the pulse-skipping configuration on a rising edge of the clock signal.

Aspect 18: A method for operating a burst-mode controller, the method comprising:

causing a switching circuit of a charge pump to be in a pulse-skipping configuration;

triggering the switching circuit to transition from the pulse-skipping configuration to a burst configuration at a time that occurs between rising edges of a clock signal; and causing a flying capacitor of the charge pump to be charged for approximately half a period of the clock signal responsive to the triggering.

Aspect 19: The method of aspect 18, further comprising resetting a rising edge of the clock signal to trigger the switching circuit to transition and cause the flying capacitor of the charge pump to be charged for approximately half the period of the clock signal.

Aspect 20: The method of aspect 18 or 19, further comprising:

triggering the switching circuit to transition from the burst configuration to the pulse-skipping configuration on a rising edge of the clock signal.

Aspect 21: The method of aspect 20, further comprising:

causing the flying capacitor to be discharged for approximately half the period of the clock signal prior to the triggering of the switching circuit to transition from the burst configuration to the pulse-skipping configuration.

Aspect 22: An apparatus comprising:

a charge pump comprising:
a flying capacitor;
a switching circuit coupled to the flying capacitor; and
a burst-mode controller coupled to the switching circuit, the burst-mode controller comprising:
a clock circuit;
a clock-reset circuit coupled to an input of the clock circuit; and
a synchronization circuit coupled to an input of the clock-reset circuit and an output of the clock circuit.

Aspect 23: The apparatus of aspect 22, wherein:
the clock circuit is configured to generate a clock signal;
the clock-reset circuit is configured to reset a rising edge of the clock signal; and
the synchronization circuit is configured to generate a burst-control signal to synchronize bursting of the charge pump to another clock signal having a frequency that is approximately two times greater than a frequency of the clock signal.

Aspect 24: The apparatus of aspect 22 or 23, wherein the burst-mode controller comprises:
a comparator circuit coupled to the input of the clock-reset circuit; and
control logic coupled to the output of the clock circuit, an output of the synchronization circuit, and the switching circuit.

Aspect 25: The apparatus of aspect 24, wherein:
the comparator circuit is configured to:
monitor an output voltage generated by the switching circuit and the flying capacitor;
compare the output voltage to a burst threshold; and
generate a burst signal having a first amplitude responsive to the output voltage being greater than the burst threshold and a second amplitude responsive to the output voltage being less than the burst threshold; and
the control logic is configured to generate signals that cause the switching circuit to be in a burst configuration and charge the flying capacitor for approximately half a period of a clock signal.

Aspect 26: The apparatus of aspect 25, wherein:
the clock-reset circuit is configured to reset a rising edge of the clock signal responsive to the burst signal having an amplitude that changes from the first amplitude to the second amplitude;
the synchronization circuit is configured to generate a burst-control signal to synchronize the burst signal to another clock signal having a frequency that is approximately two times greater than a frequency of the clock signal; and
the control logic is configured to generate a charging phase signal and a discharging phase signal based on the clock signal and the burst-control signal.

Aspect 27: The apparatus of any one of aspects 22-26, wherein the synchronization circuit comprises:
a D-type flip-flop having a data input coupled to the input of the clock-reset circuit;
a clock-doubler having an input coupled to the output of the clock circuit and an output coupled to a clock input of the D-type flip-flop; and
a logic gate having a first input coupled to the input of the clock-reset circuit and a second input coupled to an output of the D-type flip-flop.

Aspect 28: The apparatus of aspect 22, wherein:
the switching circuit is configured to selectively:
be in a burst configuration to charge and discharge the flying capacitor based on a clock signal; or
be in a pulse-skipping configuration; and
the burst-mode controller is configured to:
trigger the switching circuit to transition from the pulse-skipping configuration to the burst configuration at a time that occurs between rising edges of the clock signal; and
cause charging of the flying capacitor to occur for approximately half a period of the clock signal responsive to triggering the switching circuit to transition from the pulse-skipping configuration to the burst configuration.

Aspect 29: The apparatus of aspect 28, wherein the burst-mode controller is configured to reset a rising edge of the clock signal to trigger the switching circuit to transition from the pulse-skipping configuration to the burst configuration and cause the charging of the flying capacitor to occur for approximately half the period of the clock signal.

Aspect 30: The apparatus of aspect 28 or 29, wherein the burst-mode controller is configured to trigger the switching circuit to transition from the burst configuration to the pulse-skipping configuration on a rising edge of the clock signal.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
 a charge pump comprising:
  a flying capacitor;
  a switching circuit coupled to the flying capacitor, the switching circuit configured to selectively:
   be in a burst configuration to charge and discharge the flying capacitor based on a clock signal; or
   be in a pulse-skipping configuration; and
  a burst-mode controller coupled to the switching circuit, the burst-mode controller configured to:
   reset a rising edge of the clock signal to trigger the switching circuit to transition from the pulse-skipping configuration to the burst configuration at a time that causes the clock signal to have a shorter period than a previous period; and
   cause charging of the flying capacitor to occur for approximately half the period of the clock signal responsive to triggering the switching circuit to transition from the pulse-skipping configuration to the burst configuration.

2. The apparatus of claim 1, wherein the burst-mode controller is configured to reset the rising edge of the clock signal at a time that, prior to the reset, occurs away from rising edges of the clock signal.

3. The apparatus of claim 1, wherein:
 the burst-mode controller is configured to generate a charging phase signal based on the clock signal;
 the charging phase signal controls a set of switches of the switching circuit; and
 the charging phase signal has pulses with durations that are approximately equal to half the period of the clock signal.

4. The apparatus of claim 3, wherein the burst-mode controller is configured to reset the rising edge of the clock signal to prevent the charging phase signal from having a pulse with a duration that is substantially less than half the period of the clock signal.

5. The apparatus of claim 1, wherein the burst-mode controller is configured reset the rising edge of the clock signal at a time that occurs on the rising edge of the clock signal.

6. The apparatus of claim 5, wherein the burst-mode controller is configured to cause the switching circuit to discharge the flying capacitor for approximately half the period of the clock signal prior to resetting the rising edge of the clock signal.

7. The apparatus of claim 1, wherein the burst-mode controller comprises:
 a clock circuit;
 a clock-reset circuit coupled to an input of the clock circuit; and
 a synchronization circuit coupled to an input of the clock-reset circuit and an output of the clock circuit.

8. The apparatus of claim 7, wherein:
 the clock circuit is configured to generate the clock signal;
 the clock-reset circuit is configured to reset the rising edge of the clock signal; and
 the synchronization circuit is configured to generate a burst-control signal to synchronize the burst configuration to another clock signal having a frequency that is approximately two times greater than a frequency of the clock signal.

9. The apparatus of claim 7, wherein the burst-mode controller comprises:
 a comparator circuit coupled to the input of the clock-reset circuit; and
 control logic coupled to the output of the clock circuit, an output of the synchronization circuit, and the switching circuit.

10. The apparatus of claim 9, wherein:
 the comparator circuit is configured to:
  monitor an output voltage generated by the switching circuit and the flying capacitor;
  compare the output voltage to a burst threshold; and
  generate a burst signal having a first amplitude responsive to the output voltage being greater than the burst threshold and a second amplitude responsive to the output voltage being less than the burst threshold; and
 the control logic is configured to generate signals that cause the switching circuit to transition to the burst configuration.

11. The apparatus of claim 10, wherein:
 the clock-reset circuit is configured to reset the rising edge of the clock signal responsive to the burst signal having an amplitude that changes from the first amplitude to the second amplitude;
 the synchronization circuit is configured to generate a burst-control signal to synchronize the burst signal to another clock signal having a frequency that is approximately two times greater than a frequency of the clock signal; and
 the control logic is configured to generate a charging phase signal and a discharging phase signal based on the clock signal and the burst-control signal.

12. The apparatus of claim 7, wherein the synchronization circuit comprises:
 a D-type flip-flop having a data input coupled to the input of the clock-reset circuit;
 a clock-doubler having an input coupled to the output of the clock circuit and an output coupled to a clock input of the D-type flip-flop; and
 a logic gate having a first input coupled to the input of the clock-reset circuit and a second input coupled to an output of the D-type flip-flop.

13. The apparatus of claim 1, wherein the switching circuit comprises:
 a first switch configured to selectively connect or disconnect a first terminal of the flying capacitor to a power source;
 a second switch configured to selectively connect or disconnect a second terminal of the flying capacitor to a load;
 a third switch configured to selectively connect or disconnect the second terminal of the flying capacitor to ground; and a fourth switch configured to selectively connect or disconnect the first terminal of the flying capacitor to the load.

14. The apparatus of claim 13, wherein:
the first switch and the second switch are configured to be in an open state responsive to the switching circuit being in the pulse-skipping configuration;
the third switch is configured to be in a closed state responsive to the switching circuit being in the pulse-skipping configuration; and
the fourth switch is configured to be in the open state or the closed state responsive to the switching circuit being in the pulse-skipping configuration.

15. An apparatus comprising:
a charge pump comprising:
    capacitive means for storing energy;
    switching means for selectively connecting the capacitive means according to a burst configuration or a pulse-skipping configuration; and
    control means for:
        resetting a rising edge of a clock signal to trigger the switching means to transition from the pulse-skipping configuration to the burst configuration at a time that causes the clock signal to have a shorter period than a previous period; and
        causing the capacitive means to be charged for approximately half the period of the clock signal responsive to the triggering of the switching means to transition from the pulse-skipping configuration to the burst configuration.

16. The apparatus of claim 15, wherein the control means is configured to reset the rising edge of the clock signal at a time that, prior to the reset, occurs away from rising edges of the clock signal.

17. The apparatus of claim 15, wherein the control means comprises is configured to reset the rising edge of the clock signal at a time that occurs on the rising edge of the clock signal.

18. A method for operating a burst-mode controller, the method comprising:
causing a switching circuit of a charge pump to be in a pulse-skipping configuration;
resetting a rising edge of a clock signal to trigger the switching circuit to transition from the pulse-skipping configuration to a burst configuration at a time that causes the clock signal to have a shorter period than a previous period; and
causing a flying capacitor of the charge pump to be charged for approximately half the period of the clock signal responsive to the triggering.

19. The method of claim 18, wherein the resetting of the rising edge of the clock signal comprises resetting the rising edge of the clock signal at a time that, prior to the reset, occurs away from rising edges of the clock signal.

20. The method of claim 18, wherein the resetting of the rising edge of the clock signal comprises resetting the rising edge of the clock signal at a time that occurs on the rising edge of the clock signal.

21. The method of claim 20, further comprising:
causing the flying capacitor to be discharged for approximately half the period of the clock signal prior to resetting the rising edge of the clock signal.

22. An apparatus comprising:
a charge pump comprising:
    a flying capacitor;
    a switching circuit coupled to the flying capacitor; and
    a burst-mode controller coupled to the switching circuit, the burst-mode controller comprising:
        a clock circuit configured to generate a clock signal;
        a clock-reset circuit coupled to an input of the clock circuit, the clock-reset circuit configured to reset a rising edge of the clock signal; and
        a synchronization circuit coupled to an input of the clock-reset circuit and an output of the clock circuit, the synchronization circuit configured to generate a burst-control signal to synchronize bursting of the charge pump to another clock signal having a frequency that is approximately two times greater than a frequency of the clock signal.

23. The apparatus of claim 22, wherein the burst-mode controller comprises:
a comparator circuit coupled to the input of the clock-reset circuit; and
control logic coupled to the output of the clock circuit, an output of the synchronization circuit, and the switching circuit.

24. The apparatus of claim 23, wherein:
the comparator circuit is configured to:
    monitor an output voltage generated by the switching circuit and the flying capacitor;
    compare the output voltage to a burst threshold; and
    generate a burst signal having a first amplitude responsive to the output voltage being greater than the burst threshold and a second amplitude responsive to the output voltage being less than the burst threshold; and
the control logic is configured to generate signals that cause the switching circuit to be in a burst configuration and charge the flying capacitor for approximately half a period of the clock signal.

25. The apparatus of claim 24, wherein:
the clock-reset circuit is configured to reset the rising edge of the clock signal responsive to the burst signal having an amplitude that changes from the first amplitude to the second amplitude; and
the synchronization circuit is configured to generate a burst-control signal to synchronize the burst signal to the other clock signal; and
the control logic is configured to generate a charging phase signal and a discharging phase signal based on the clock signal and the burst-control signal.

26. The apparatus of claim 22, wherein the synchronization circuit comprises:
a D-type flip-flop having a data input coupled to the input of the clock-reset circuit;
a clock-doubler having an input coupled to the output of the clock circuit and an output coupled to a clock input of the D-type flip-flop; and
a logic gate having a first input coupled to the input of the clock-reset circuit and a second input coupled to an output of the D-type flip-flop.

27. The apparatus of claim 22, wherein:
the switching circuit is configured to selectively:
    be in a burst configuration to charge and discharge the flying capacitor based on the clock signal; or
    be in a pulse-skipping configuration; and
the burst-mode controller is configured to:
    trigger the switching circuit to transition from the pulse-skipping configuration to the burst configuration at a time that occurs between away from rising edges of the clock signal; and cause charging of the flying capacitor to occur for approximately half a period of the clock signal responsive to triggering the switching circuit to transition from the pulse-skipping configuration to the burst configuration.

28. The apparatus of claim 27, wherein the burst-mode controller is configured to reset the rising edge of the clock signal to trigger the switching circuit to transition from the pulse-skipping configuration to the burst configuration and cause the charging of the flying capacitor to occur for approximately half the period of the clock signal.

29. The apparatus of claim 27, wherein the burst-mode controller is configured to trigger the switching circuit to transition from the burst configuration to the pulse-skipping configuration on the rising edge of the clock signal.

30. The apparatus of claim 15, wherein the control means comprises means for synchronizing bursting of the charge pump to another clock signal having a frequency that is approximately two times greater than a frequency of the clock signal.

* * * * *